(12) United States Patent
Gkantsidis et al.

(10) Patent No.: US 9,729,624 B2
(45) Date of Patent: Aug. 8, 2017

(54) ENCODING AND DECODING OPTIMISATIONS

(75) Inventors: Christos Gkantsidis, Cambridge (GB); John Miller, Cambridge (GB); Manuel Costa, Cambridge (GB); Pablo Rodriguez, Cambridge (GB); Stuart Ranson, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 466 days.

(21) Appl. No.: 12/097,980

(22) PCT Filed: Dec. 4, 2006

(86) PCT No.: PCT/US2006/046207
§ 371 (c)(1),
(2), (4) Date: Jul. 15, 2008

(87) PCT Pub. No.: WO2007/075263
PCT Pub. Date: Jul. 5, 2007

(65) Prior Publication Data
US 2009/0248898 A1 Oct. 1, 2009

(30) Foreign Application Priority Data
Dec. 22, 2005 (EP) .................................. 05270098

(51) Int. Cl.
*H04L 29/08* (2006.01)
*H03M 13/37* (2006.01)

(52) U.S. Cl.
CPC .......... *H04L 67/104* (2013.01); *H04L 67/108* (2013.01); *H04L 67/1076* (2013.01); *H03M 13/3761* (2013.01)

(58) Field of Classification Search
CPC ................................................. H03M 13/3761
USPC ...................... 709/229, 231, 246; 341/50, 58
See application file for complete search history.

(56) References Cited

U.S. PATENT DOCUMENTS

| | | | |
|---|---|---|---|
| 5,396,239 A * | 3/1995 | McMahon et al. | 341/58 |
| 5,677,734 A * | 10/1997 | Oikawa et al. | 375/240.04 |
| 5,721,878 A | 2/1998 | Ottesen et al. | |
| 5,818,529 A * | 10/1998 | Asamura et al. | 375/240.23 |
| 5,923,786 A * | 7/1999 | Murayama | 382/242 |
| 6,466,999 B1 * | 10/2002 | Sliger | G06F 8/68 707/999.101 |
| 2001/0028617 A1 * | 10/2001 | Mashimo et al. | 369/47.53 |
| 2003/0113025 A1 * | 6/2003 | Bard | H04N 19/197 382/239 |
| 2003/0128762 A1 * | 7/2003 | Nakagawa et al. | 375/240.16 |

(Continued)

FOREIGN PATENT DOCUMENTS

| | | |
|---|---|---|
| KR | 1020020093909 A | 12/2002 |
| WO | WO02065774 | 8/2002 |

*Primary Examiner* — Larry Donaghue
(74) *Attorney, Agent, or Firm* — Lee & Hayes, PLLC

(57) ABSTRACT

The invention provides methods of encoding content for distribution over a network and methods for decoding encoded content which has been distributed over the network. In a first example in which the content is divided into a plurality of segments and each segment comprising a plurality of blocks of data, the method comprises selecting a segment from the plurality of segments and selecting at least two blocks of the selected segment from a store of blocks. A new encoded block is created from a linear combination of the selected blocks.

19 Claims, 11 Drawing Sheets

(56) References Cited

U.S. PATENT DOCUMENTS

| | | | |
|---|---|---|---|
| 2005/0152452 A1* | 7/2005 | Suzuki | 375/240.16 |
| 2006/0017591 A1* | 1/2006 | Bossen | 341/50 |
| 2006/0188014 A1* | 8/2006 | Civanlar et al. | 375/240.03 |
| 2006/0224760 A1* | 10/2006 | Yu | H04L 65/607 |
| | | | 709/231 |

* cited by examiner

|   | 50  | 100  | 150  | 200  |
|---|-----|------|------|------|
| 1 | 50  | 100  | 150  | 200  |
| 2 | 100 | 200  | 300  | 400  |
| 3 | 150 | 300  | 350  | 600  |
| 4 | 200 | 400  | 600  | 800  |
| 5 | 250 | (500)| 750  | 1000 |
| 6 | 300 | 600  | 900  | 1200 |
| 7 | 350 | 700  | 1050 | 1400 |
| 8 | 400 | 800  | 1200 | 1600 |
| 9 | 450 | 900  | 1350 | 1800 |
| 10| 500 | 1000 | 1500 | 2000 |

FIG. 9

ENCODING AND DECODING OPTIMISATIONS

RELATED APPLICATIONS

This application is a National Stage of International Application No. PCT/US2006/046207, filed 4 Dec. 2006, which claims priority from European Patent Application No. 05270098.6, filed on Dec. 22, 2005. Both applications are incorporated herein by reference.

BACKGROUND

Content distribution systems have been developed to enable data such as software updates, critical patches, and multimedia content to be distributed to nodes in a network. Typically these systems comprised many servers which were placed in the network, with nodes connecting directly to one of the servers to download the required file. However, such systems are constrained by the connection bandwidth to the servers and require considerable investment to increase the capacity of the system. Consequently, content distribution systems have been developed which rely on a fully distributed architecture with nodes in the network participating in the distribution process. Such systems may be referred to as peer-to-peer or peer-assisted content distribution systems. In such a system, the server may divide the file to be distributed into a number of blocks and provide these blocks to nodes in the network. As soon as a node has received one or more blocks, the node can act as a source of the received blocks for other nodes whilst concurrently receiving further blocks until they have received all the blocks of the file. Unless nodes are aware of which blocks are both required and held by other nodes in the network, such systems can experience problems including rare blocks and network bottlenecks.

More recently, cooperative content distribution systems have been developed to avoid the rare block problem and the requirement for a node to be aware of all the other nodes in the system. Such systems use network coding, which means that each node in the system generates and transmits encoded blocks of information, these newly encoded blocks being a linear combination of all the blocks currently held by the particular node. This compares to earlier systems where the encoding of the blocks only occurred at the server.

The use of network coding can be described with reference to FIG. 1, which shows the flow of blocks between a server 102 and two clients (or nodes), client A 104 and client B 106. Initially all the blocks, $B_1$-$B_n$, are held only by the server and not by any nodes. When client A contacts the server to get a block, the server produces an encoded block $E_1$ which is a linear combination of all the blocks in the file, such that:

$$E_1 = \alpha_1 B_1 + \alpha_2 B_2 + \ldots + \alpha_n B_n$$

where $\alpha_i$ are random coefficients. In order that the block size does not increase in size, these operations take place within a finite field, typically $GF(2^{16})$. The server then transmits to client A both the newly encoded block $E_1$ and the coefficient vector ($\alpha_i$). Client A may also receive a second encoded block $E_2$ from the server, created using a second set of random coefficients $\beta_i$. When client A needs to transmit a block to client B, client A creates a third encoded block, $E_3$ from a linear combination of $E_1$ and $E_2$ using random coefficients $\omega_i$.

When network coding is used as described above, a client can recover the original file after receiving n blocks that are linearly independent from each other, in a process similar to solving a set of linear equations. If the coefficients are chosen at random by each client, a client will be unlikely to receive a block which is not of use to that client. However, to further check this, clients may transmit the coefficient vector to a receiving client (client B in the example of FIG. 1) in advance of the block itself. The receiving client can then check whether the resultant block would provide it with any new information and only request the downloading of the block if it will be of use to the receiving client.

As described above, in order for a node to be able to generate a newly encoded block it must read all the blocks it has received into memory. This is processor intensive and introduces delays. Additionally when decoding, a node is faced by a very complex problem of decoding the encoded blocks, which is again processor intensive and time consuming. Read/write operations into and out of memory at the node are particularly time consuming.

SUMMARY

This summary is provided to introduce a selection of concepts in a simplified form that are further described below in the detailed description. This summary is not intended to identify key features or essential features of the claimed subject matter nor is it intended to be used as an aid in determining the scope of the claimed subject matter.

Methods of encoding content for distribution over a network are described along with methods for decoding encoded content which has been distributed over the network.

A first example provides a method of encoding content for distribution over a network. The content for distribution is divided into a plurality of segments and each segment comprises a number of blocks of data. The method comprises selecting a segment from the plurality of segments, selecting at least two blocks of the selected segment from a store of blocks and creating a new encoded block from a linear combination of the selected at least two blocks.

Advantageously, this results in a considerable saving in encoding time and processing requirements because in order to encode content, only those blocks from a single segment need to be read into memory.

The step of selecting a segment may comprise an infrequent but periodic step of selecting all of the plurality of segments. Advantageously, this mitigates against a rare segment problem, by creating a small number of blocks which can be used in place of a block from any segment.

Selecting a segment may comprise randomly selecting a segment from the plurality of segments.

Selecting a segment may comprise selecting a segment from the plurality of segments according to a specified sequence.

The step of selecting at least two blocks may comprise selecting all available blocks of the selected segment from a store of blocks.

In an example, each segment may comprise a plurality of un-encoded blocks; and selecting at least two blocks may comprise: selecting at least two encoded blocks of the selected segment from a store of encoded blocks; and creating a new encoded block may comprise: creating a new encoded block from a linear combination of the selected at least two encoded blocks.

For example, selecting at least two encoded blocks may comprise selecting a target degree for a new encoded block, wherein a degree of an encoded block is a number of un-encoded blocks from which the encoded block is created; attempting to select at least two encoded blocks of the selected segment from the store of encoded blocks to create a new encoded block having a degree which does not exceed the target degree; if the attempt fails, increasing the target degree by one and repeating the attempting step; and if the attempt succeeds, selecting at least two encoded blocks of the selected segment from the store of encoded blocks to create the new encoded block having a degree which does not exceed the target degree.

The method may also comprise storing the new encoded block.

The new encoded block may, for example, be created using a pre-computed look up table. Advantageously, this reduces processing time and load because calculations are not computed but are performed doing a look-up in the pre-computed table.

A second example provides a method of encoding content for distribution over a network where the content is divided into a plurality of unencoded blocks of data. The method comprises selecting a target degree for a new encoded block, where the degree of an encoded block is defined as a number of unencoded blocks from which the encoded block is created. The method also comprises attempting to select a plurality of encoded blocks from a store of encoded blocks to create a new encoded block having a degree which does not exceed the target degree. If this attempt fails, the target degree is increased by one and the attempting step is repeated. However, if the attempt succeeds a new encoded block is created from a linear combination of the selected plurality of encoded blocks.

Advantageously, this method of encoding maintains the sparseness of a matrix, whilst still having the benefits of network encoding. This reduces the complexity and hence processing time and processing load required to decode the content.

In an example the selected plurality of encoded blocks comprises a maximum number of encoded blocks from which the new encoded block can be created having a degree which does not exceed the target degree.

The method may also comprise storing the new encoded block.

The new encoded block may for example be created using a pre-computed look up table.

A third example provides a method of encoding content for distribution over a network where the content is divided into a plurality of blocks of data. The method comprises selecting a plurality of blocks from a store of blocks in the network, creating a new encoded block from a linear combination of the selected blocks and storing that new encoded block.

Advantageously, this reduces the number of read operations that a node must perform to form a newly encoded block. This reduces the time taken to encode the block.

The new encoded block may for example be stored in a cache.

In an example the new encoded block may be stored for a predetermined period of time.

The store of blocks may comprise a first part located in a main memory of a node and a second part located in a cache of the node.

The new encoded block may be created using a pre-computed look up table.

A further example provides a method of encoding content for distribution over a network in which newly encoded blocks, which have been created and sent to another node in the network, are held in a cache. The cached encoded blocks are therefore available to be used again in creating further new encoded blocks of content for distribution over the network.

Another example provides a method of decoding content received in the form of a plurality of encoded blocks from across a network. The method includes using a message passing technique to decode and simplify a matrix formed from the coefficient vectors for the received encoded blocks. Matrix inversion is then used on the resultant matrix to complete the decoding process.

Advantageously, this reduces the decoding time and the processing load during decoding by simplifying the matrix where possible before performing the processor intensive matrix inversion.

A further example provides a method for decoding content received in the form of a plurality of encoded blocks from across a network, in which the original content was divided into segments. The method includes reading into memory all the received blocks relating to a particular segment and then decoding those read blocks in parallel.

Advantageously, this results in a considerable saving in decoding time and processing load because in order to decode content, only those blocks from a single segment need to be read into memory. A further advantage is that it reduces the required number of processor operations in the decoding process and therefore reduces both decoding time and processor load.

A further example provides a method of decoding content received across a network, the received content comprising a plurality of encoded blocks. The method involves reading a small portion of each received encoded block into memory and decoding the read portions in parallel before reading a next portion of each of the encoded blocks into the memory.

Advantageously, this is very efficient and allows a computer operating system to assist in preparing for the decoding process by pre-loading the next portions to be required. This reduces delays in the decoding process and therefore reduces the overall decoding time.

The methods can be carried out using a computer program comprising computer program code means adapted to perform all the steps of any of the methods described above when said program is run on a computer. That computer program can be embodied on a computer readable medium.

The methods described herein may be performed by software or firmware in machine readable form on a storage medium. The software or firmware may be suitable for execution on a parallel processor or a serial processor such that the method steps may be carried out in any suitable order, or simultaneously.

This acknowledges that software and firmware can be a valuable, separately tradable commodity. It is intended to encompass software, which runs on or controls "dumb" or standard hardware, to carry out the desired functions. For similar reasons, it is also intended to encompass software which "describes" or defines the configuration of hardware, such as HDL (hardware description language) software, as is used for designing silicon chips, or for configuring universal programmable chips, to carry out desired functions.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 9 shows an example look-up table;

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilised. The description sets forth the functions of the example and the sequence of steps for constructing and operating the example. However, the same or equivalent functions and sequences may be accomplished by different examples.

In order to reduce the number of read/write operations involved in both encoding and decoding at nodes in a peer-assisted content distribution system, a number of optimisations of the encoding and decoding processes can be used. These optimisations reduce the processing load at the node and reduce the amount of time taken to encode or decode a block.

Figure 1:
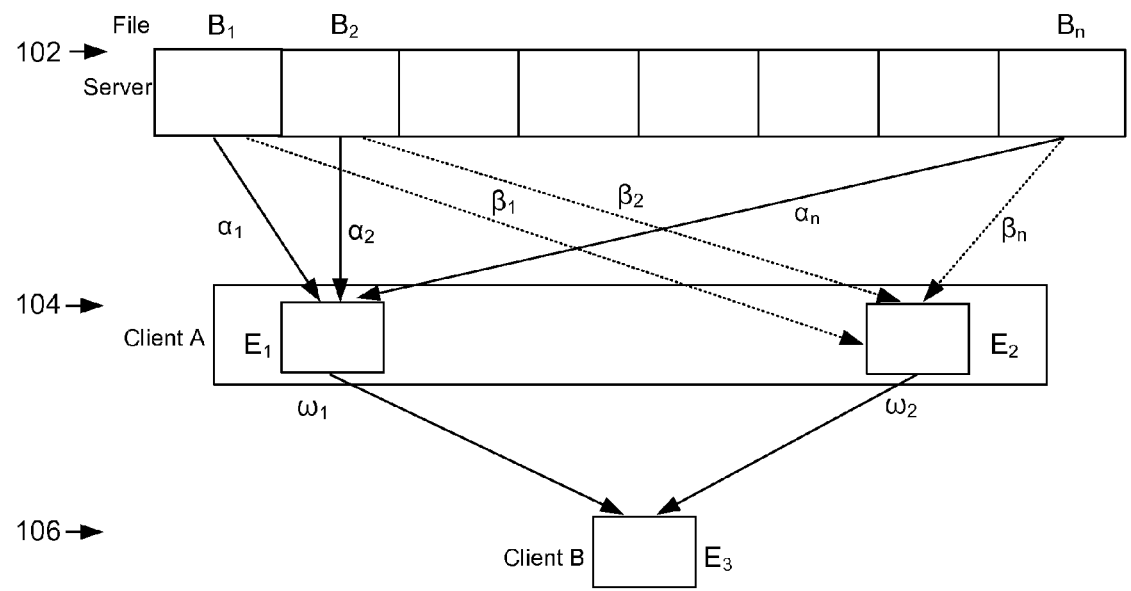
FIG. 1 shows a flow of blocks in a content distribution system using network coding.
Figure 2:
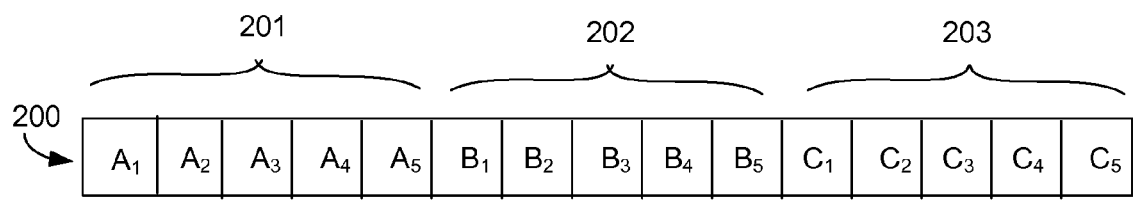
FIG. 2 is a schematic diagram of a file divided into blocks.
Figure 3:
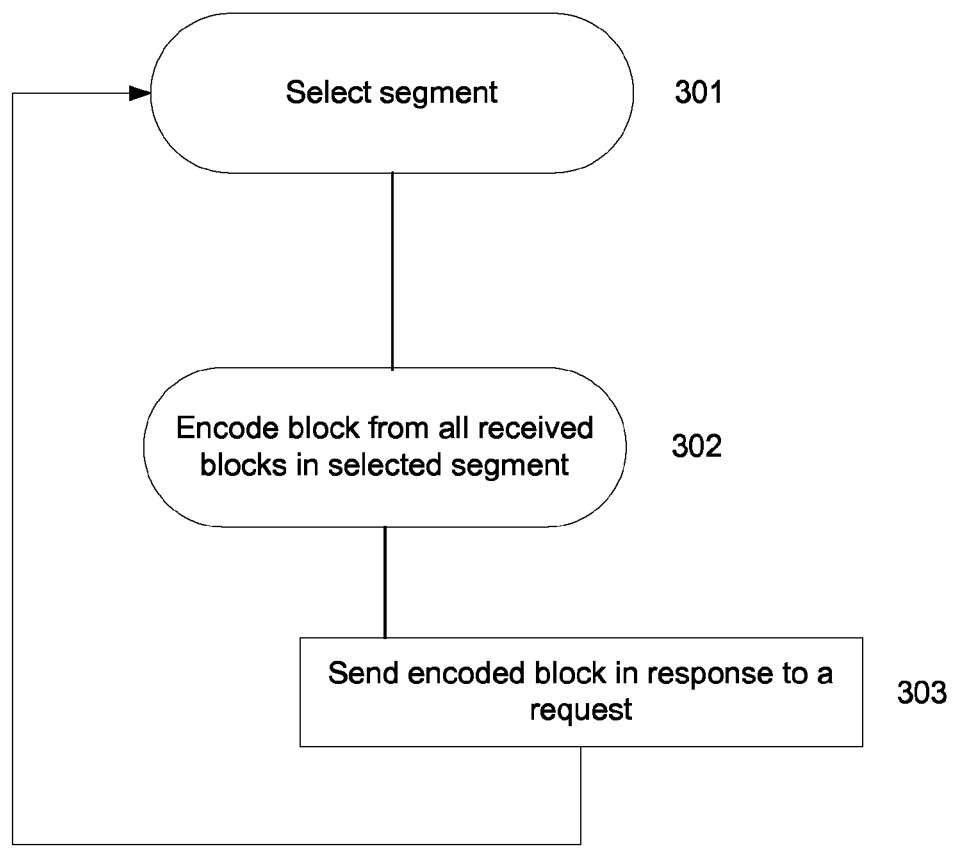
FIG. 3 shows a flow diagram of a first encoding optimisation example.
Figure 4:
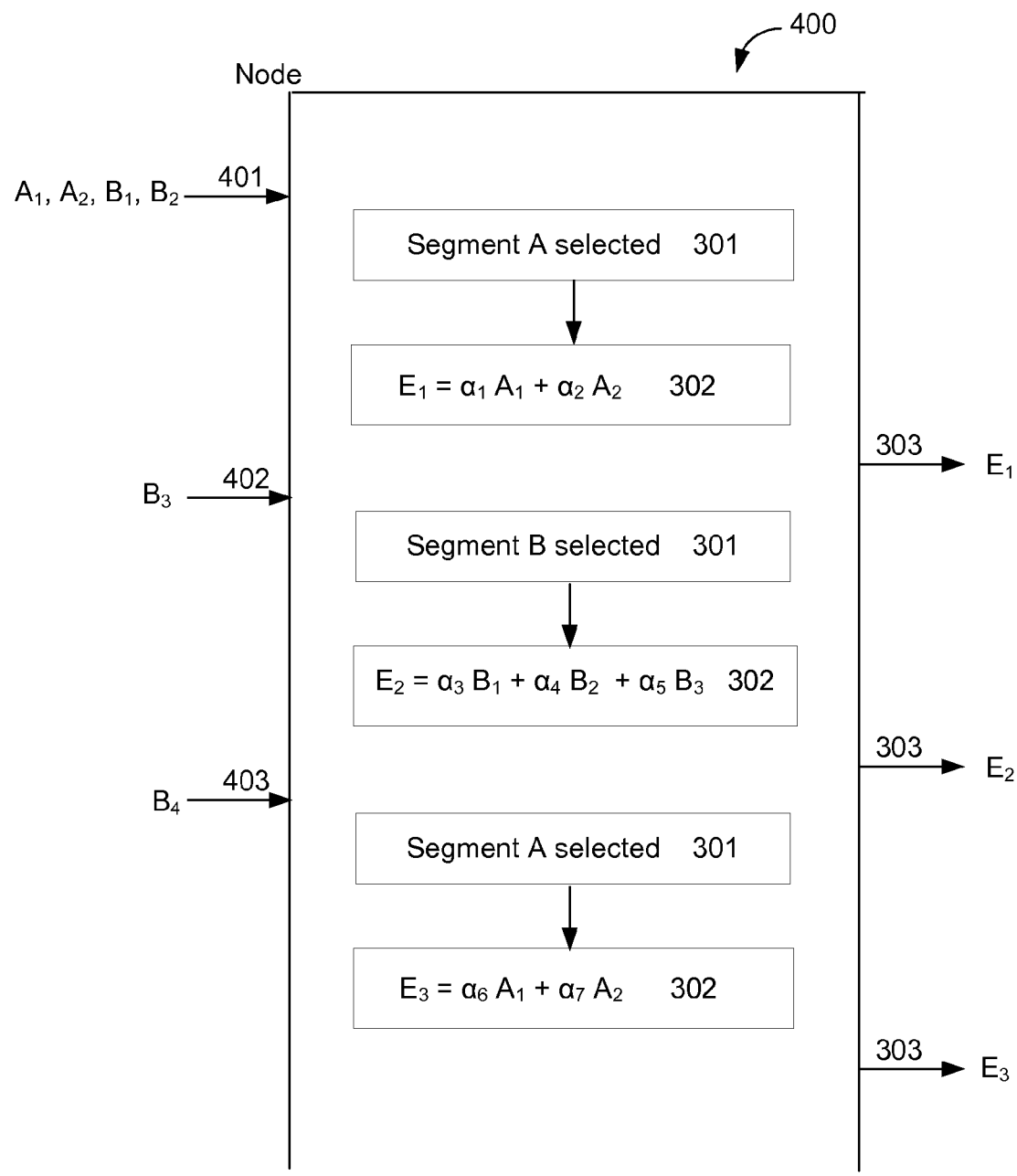
FIG. 4 is a schematic diagram showing the implementation of the first optimisation example.

In a first encoding optimisation example, the file is divided into a number of segments, each segment containing a number of blocks, as shown schematically in FIG. 2. FIG. 2 shows a file 200 which is divided into 3 segments 201-203, each comprising 5 blocks. This is by way of example only and typically the number of blocks would be much larger than the number of segments (e.g. 20-30 blocks in a segment or a segment being 100-200 Mbytes with a block being 1-10 Mbytes). As shown in the diagrams of FIGS. 3 and 4, an encoded block is produced by a node 400 as a linear combination of all the blocks it holds from a particular segment. A segment is first selected (step 301), the new block is encoded (step 302) then passed upon request to another node (step 303). Another segment is then selected (step 301), another new block is encoded (step 302) and passed to another node (step 303) and this process continues. The selection of the segment (in step 301) may be according to a defined sequence (e.g. segment A, then segment B, then segment A etc), may be random or may be performed according to any other criteria (e.g. selection of the rarest segment in the neighborhood). Whilst this encoding and transmitting process of FIG. 3 operates, the node may also be receiving blocks (encoded or un-encoded) from other nodes in a network (steps 401-403).

The selection of the segment to encode according to a defined sequence or using random selection, coupled with the fact that there are many more blocks than segments, should result in all segments being available within a network with no segment being particularly rare. However, to further assist in preventing a rare segment problem, a few encoded blocks may be generated as a linear combination of all the blocks from all the segments of the file. Such generation of a block from all segments may be an infrequent but periodic event (e.g. every $100^{th}$ iteration of the process). These encoded blocks can therefore be used in place of a block of any segment in the file. This may be implemented by including such an instruction in the sequence for selecting the next block (in step 304) or by assigning a small possibility to the selection of all segments in a random segment selection step.

By using such an encoding optimisation, in order to encode a block a node only has to read into its memory all the blocks from a single segment and not all the blocks that it has received from the whole file. This may be a considerable saving in time and processing capability if, for example, a segment comprises 30 blocks whilst a file comprises 3000 blocks.

Although the above description are with reference to FIGS. 3 and 4 describe that an encoded block is produced as a linear combination of all the blocks held locally at a node from a particular segment, in another example the encoded block could be produced from a linear combination of two or more of the blocks it holds locally from a particular segment. The number of blocks used to form an encoded block may be fixed or may vary according to specified criteria or alternatively in another example the number of blocks selected may be selected randomly.

Figure 5:
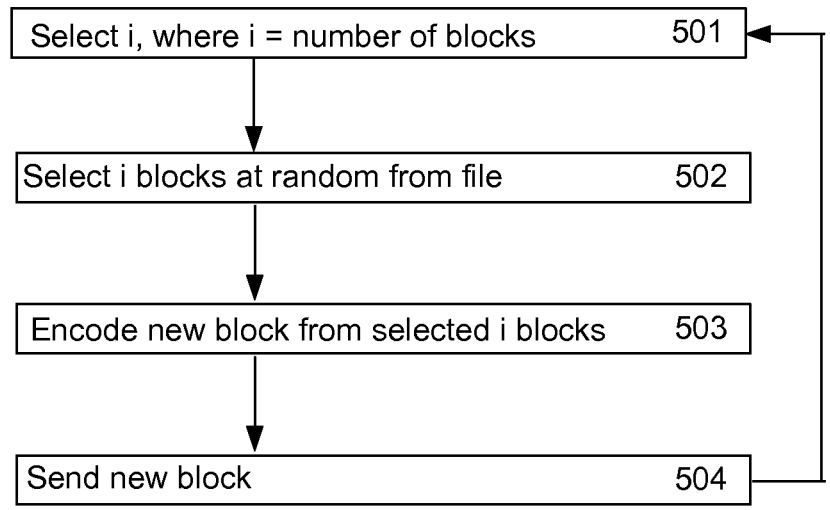
FIG. 5 shows an example flow diagram of an encoding process at a server.

In a second encoding optimisation example, the server which holds the entire file produces sparse encoded blocks. A sparse block is defined as a block with a small number of non-zero entries. The encoded blocks produced by the server are a linear combination of i random blocks from the file, where the probability of selecting i blocks is given by p(i) and p(i) may be 1/i, an exponential distribution, binomial distribution etc. FIG. 5 shows a flow diagram of the encoding process at the server. First is selected (step 501), then i blocks are selected at random from all the blocks in the file (step 502) and used to produce a new encoded block (step 503). The newly encoded block is sent to a node in the network (step 504) and then a new value of i is selected (step 501) and the process is repeated. Using such a distribution, the server is biased towards selecting a small number of blocks to use to encode a new encoded block, but the server will occasionally encode a block from a larger number of blocks. These newly encoded blocks where i is large act in the same way as the blocks encoded from all the segments, as described above with reference to the first example, and reduce the chance that information relating to a particular block will be rare in the network.

Figure 6:
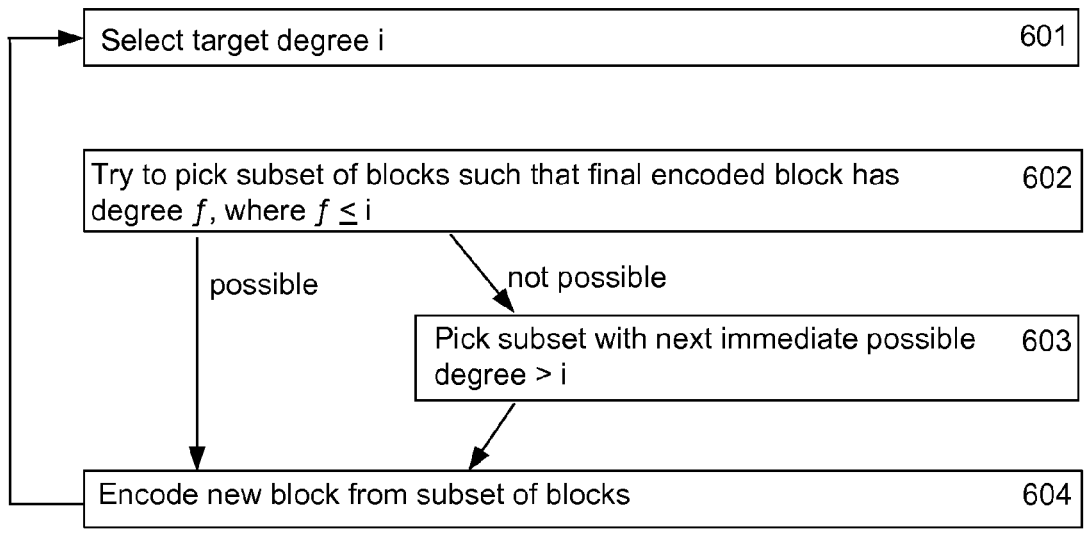
FIG. 6 shows an example flow diagram for an encoding process which preserves sparseness.
Figure 7:
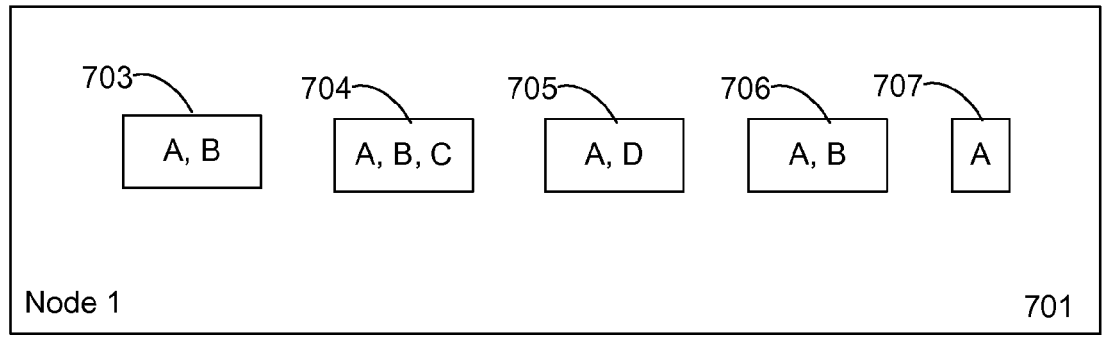
FIG. 7 is a schematic diagram of two nodes.
Figure 7:
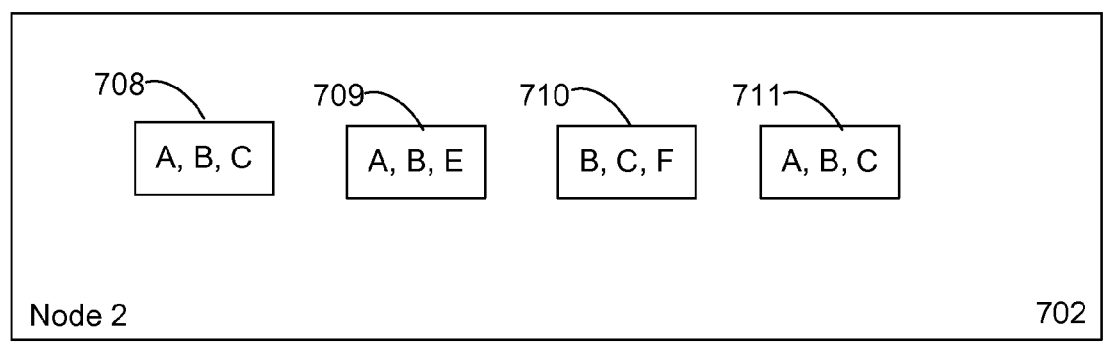

In such an example, the nodes in the network may either not re-encode the content, thus maintaining the sparseness of the network but losing some of the benefits of network coding, or may re-encode the content using rules to ensure that the blocks remain sparsely encoded. An example process by which sparseness can be preserved can be described with reference to FIGS. 6 and 7. FIG. 6 shows an example flow diagram 600 and FIG. 7 shows a schematic diagram of two nodes 701, 702 each of which currently holds a number of encoded blocks 703-707, 708-711 from the same original file comprising 6 blocks. The original blocks are labelled A-F and the letters inside the encoded blocks 703-711 indicate which blocks the encoded blocks have been produced from e.g. block 703 is a linear combination of original blocks A and B.

The node first selects a target degree i (step 601), where the degree of a block is defined as the number of original blocks that the encoded block is formed from (e.g. block 703 has degree i=2). The node then tries to pick a subset of the blocks that it currently holds such that a newly encoded block will have a degree f, where f≤i (step 602). If this is not possible, the node picks a subset such that a newly encoded block will have the next highest possible degree (step 603). Having selected a subset of blocks (in step 602 or 603), the node encodes a new block from the selected subset (step 604). The process is then repeated. Preferably the node selects as many blocks as possible to form part of the subset whilst not exceeding the target degree. For example, if the target degree is set equal to 2, node 1 701 (in FIG. 7) can select 3 blocks to form the subset, blocks 703, 706 and 707. A newly encoded block produced from these three blocks will have a degree of 2 as it is a linear combination of the original blocks A and B. However, node 2 702 cannot select a subset of blocks to satisfy the target degree of 2. Instead, a subset will have to be selected with a degree of 3 (according to step 603); the subset comprising two blocks, blocks 708 and 711, each being a linear combination of original blocks A, B and C.

In the above example with node 2 702, two blocks each comprising linear combinations of original blocks A, B and C were combined to form a new linear combination of A, B and C. It is preferable to combine these two blocks and send these to a new node, because if the receiving node already possesses one of the blocks (e.g. block 708), the new block will provide new information for the node whilst sending the same block again may be useless to the receiving node.

Figure 8:
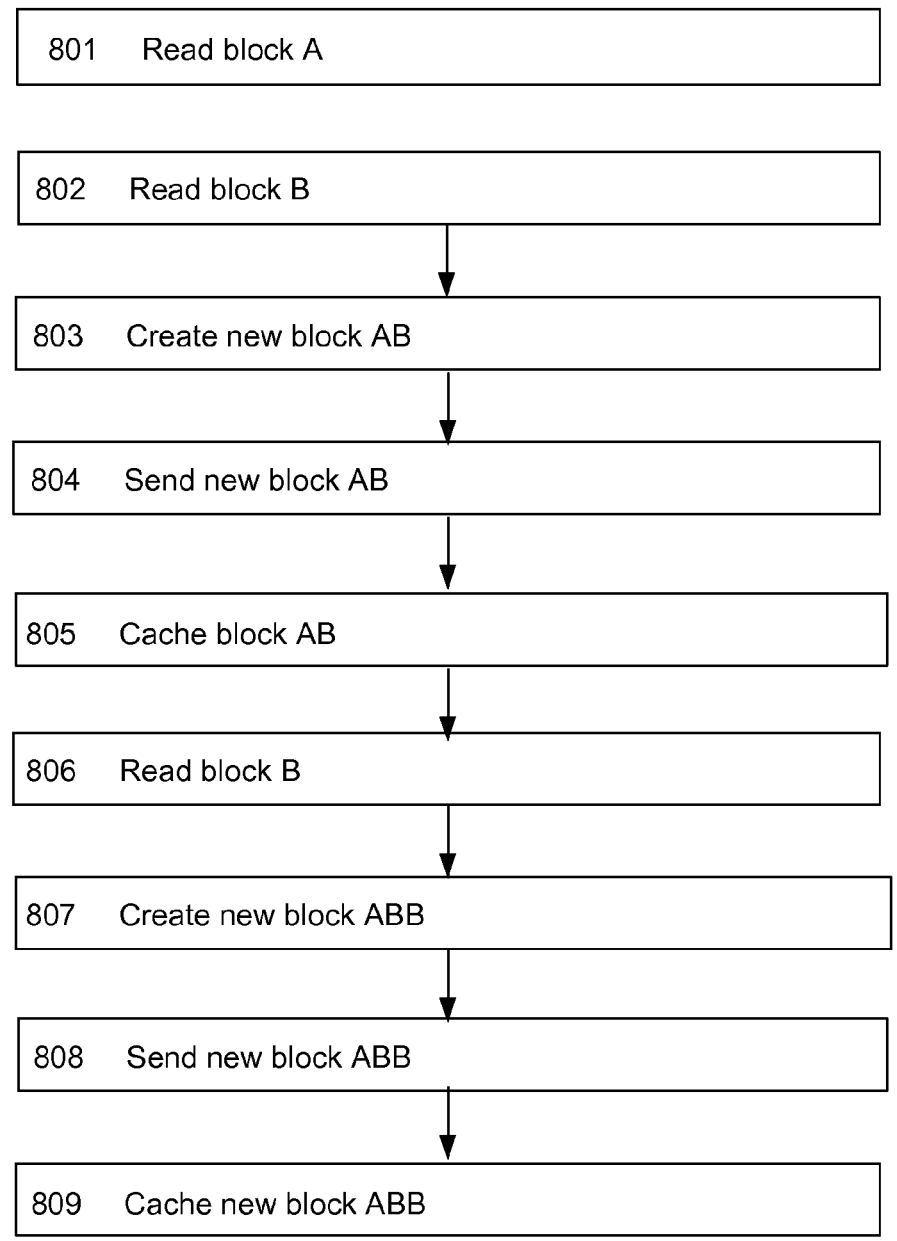
FIG. 8 shows a flow diagram of another encoding optimisation example.

In the examples described above and in known systems, once a newly encoded block has been created by a node and sent to another node, the information relating to that newly encoded block is not stored. However, in a third encoding optimisation example, some of the encoded blocks which have been created by a node are cached and used again. This again is beneficial because it reduces the number of read operations that a node must perform in order to produce an encoded block to send to another node in the system. The term 'cache' is used to describe a fast storage buffer associated with a processing unit, which operates at a faster speed than the main memory in a node. This optimisation is shown in the example flow diagram of FIG. 8. An example node has received two blocks, A and B and initially reads in both these blocks (steps 801, 802) and creates a newly encoded block AB (step 803) which is a linear combination of blocks A and B. This newly encoded blocks AB is sent to another node in the network (step 804) and cached at the node (step 805). When the node next needs to create a newly encoded block to send to another node in the network, it already has block AB in its cache and may decide to either send this block again or to combine it with one or more blocks that it has received. In this example, the node reads block B (step 806) and uses block B and previously cached block AB to create a newly encoded block ABB (step 807), which is then sent to another node in the network (step 808). As before, the node may retain block ABB in the cache (step 809) or may alternatively not store information about this block in the cache. If the node stores block ABB in the cache (as shown in FIG. 8), in a subsequent step the node could use cached blocks AB and ABB to create a newly encoded block without the need to perform any additional read operations. The number of blocks which may be held in the cache is limited by the capacity of the cache which is substantially smaller than the capacity of the main memory of the node where the information on all the blocks received is stored.

In the encoding steps described above and in known methods, a substantial amount of time is taken in the arithmetic operations associated with creating the linear combination of blocks which forms a newly encoded block. However, as the arithmetic operations are all taking place within a finite field, also referred to as a Galois field, (typically $2^{16}$, but potentially much smaller, e.g. 256), a fourth encoding optimisation example involves pre-computing the outcomes of all possible arithmetic operations which reduces the operation to a single table look-up. In a very simple example, the following operation is to be computed:

$$5 \times 100$$

This can either be calculated using the following four steps:

$$100 + 100 = 200$$
$$+ 100 = 300$$
$$+ 100 = 400$$
$$+ 100 = 500$$

Or alternatively be determined by a single look up in a table, such as the one shown in FIG. 9.

In another example, the multiplication of two numbers in a finite (or Galois) field can be implemented using three table look up steps. The following equivalence is used to perform the multiplication:

$$A = B \cdot C$$

$$\log A = \log B + \log C$$

$$\exp(\log A) = \exp(\log B + \log C)$$

$$A = \exp(\log B + \log C)$$

The multiplication can then be reduced to three look up steps in the following two tables in which a finite field of $2^{16}$ is used by way of example only:

logTable=vector of 65536(=$2^{16}$)elements containing the logarithm of each number in the field(logarithm of each of 0 to 65536).

expTable=vector of 131072(=$2 \times 2^{16}$)elements containing the exponential of each number in the field plus the next $2^{16}$ numbers(exponential of each of 0 to 131072).

An the multiplication can then be performed as follows:

function Mult(*B,C*)

Temp=logTable[*B*]+logTable[*C*]

return expTable[Temp]

The above description relates to encoding optimisations which may be employed to reduce the processing load and time required to encode new blocks of data for transmission to other nodes in the network. Each of the above optimisations may be implemented independently of the others or alternatively two or more of the optimisation techniques may be used in combination to further increase the optimisation of the encoding process.

Some or all of the above encoding optimisations may also improve the decoding process, for example a sparse encoded block (see second example above) will be much easier to decode than a densely populated encoded block and blocks of a smaller degree will be easier to decode that blocks with a larger degree. In addition, decoding optimisations may also be employed which operate orthogonally to the encoding optimisations used and also assist in reducing the number of read/write operations required in decoding.

There are a number of known decoding techniques including matrix inversion and message passing. These techniques can be applied to a matrix formed from the coefficient vectors for each of the received blocks (referred to herein as a matrix of coefficients), for example where a node has received 3 encoded blocks relating to a file comprising 3 original blocks the following coefficient vectors may be received with the encoded blocks:

1$^{st}$ received coefficient vector: [6, 90, 52]
2$^{nd}$ received coefficient vector: [18, 2, 128]
3$^{rd}$ received coefficient vector: [231, 93, 287]

These vectors can be written as a 3×3 matrix (the matrix of coefficients):

$$\begin{pmatrix} 6 & 90 & 52 \\ 18 & 2 & 128 \\ 231 & 93 & 287 \end{pmatrix}$$

Matrix inversion can be very complex but is possible in all cases (as long as the matrix is full rank). The message passing algorithm, also known as the belief propagation algorithm and the sum-product algorithm simplifies the matrix but is not always possible since progressive iterative solving may fail.

Figure 10:
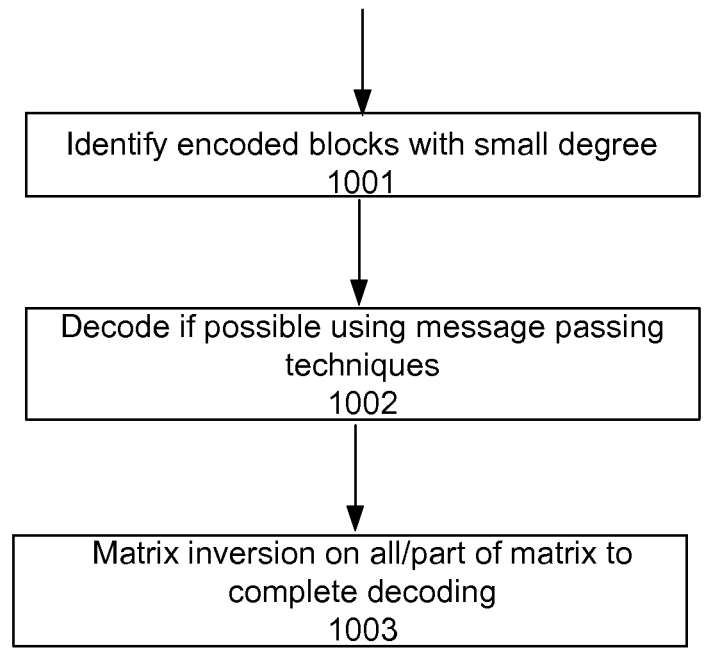
FIG. 10 shows a flow diagram of a decoding optimisation example.

In a first decoding optimisation example, the two decoding techniques are combined as shown in FIG. 10. First, encoded blocks having a small degree i, i.e. those blocks which are a linear combination of a small number (i) of unencoded blocks from the original file are identified from all the encoded blocks which have been received by the node (step 1001). These selected blocks may then be decoded as far as possible using a technique such as message passing, which preserves the sparseness of the matrix (step 1002). Having simplified the matrix as far as possible, matrix inversion can then be used on all or part of the matrix to complete the decoding process (step 1003).

An example of the decoding process can be described as follows. Assuming the following matrix:

$$\begin{bmatrix} 3 & 1 & 0 & 0 \\ 0 & 7 & 0 & 0 \\ 1 & 2 & 2 & 4 \\ 5 & 6 & 1 & 8 \end{bmatrix}$$

where the entries of the matrix are the encoding coefficients. In the first step it is identified that the second row contains a single non-zero element, which is reduced from the other rows to get the following matrix:

$$\begin{bmatrix} 3 & 0 & 0 & 0 \\ 0 & 1 & 0 & 0 \\ 1 & 0 & 2 & 4 \\ 5 & 0 & 1 & 8 \end{bmatrix}$$

The reduction created a new row with a single non-zero entry (this is row number 1).

This row is reduced from the rest of the matrix to get:

$$\begin{bmatrix} 1 & 0 & 0 & 0 \\ 0 & 1 & 0 & 0 \\ 0 & 0 & 2 & 4 \\ 0 & 0 & 1 & 8 \end{bmatrix}$$

The rest lower part of the matrix cannot be reduced further and, hence, matrix inversion is performed to get the final matrix:

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

At each step of the algorithm, the following two things occur: simplification of the matrix of coefficients, and, also, updating of the encoded content. As a result, by the end of the algorithm, the original information has been recovered.

The decoding process, as shown in FIG. 10 may start once the required number of blocks has been received by the node and the node has stopped receiving further blocks. This may be advantageous because it allows the simplification of the matrix (in step 1002) to be performed on a large scale with as much information as possible. This makes the matrix inversion process (step 1003) simpler.

Figure 11:
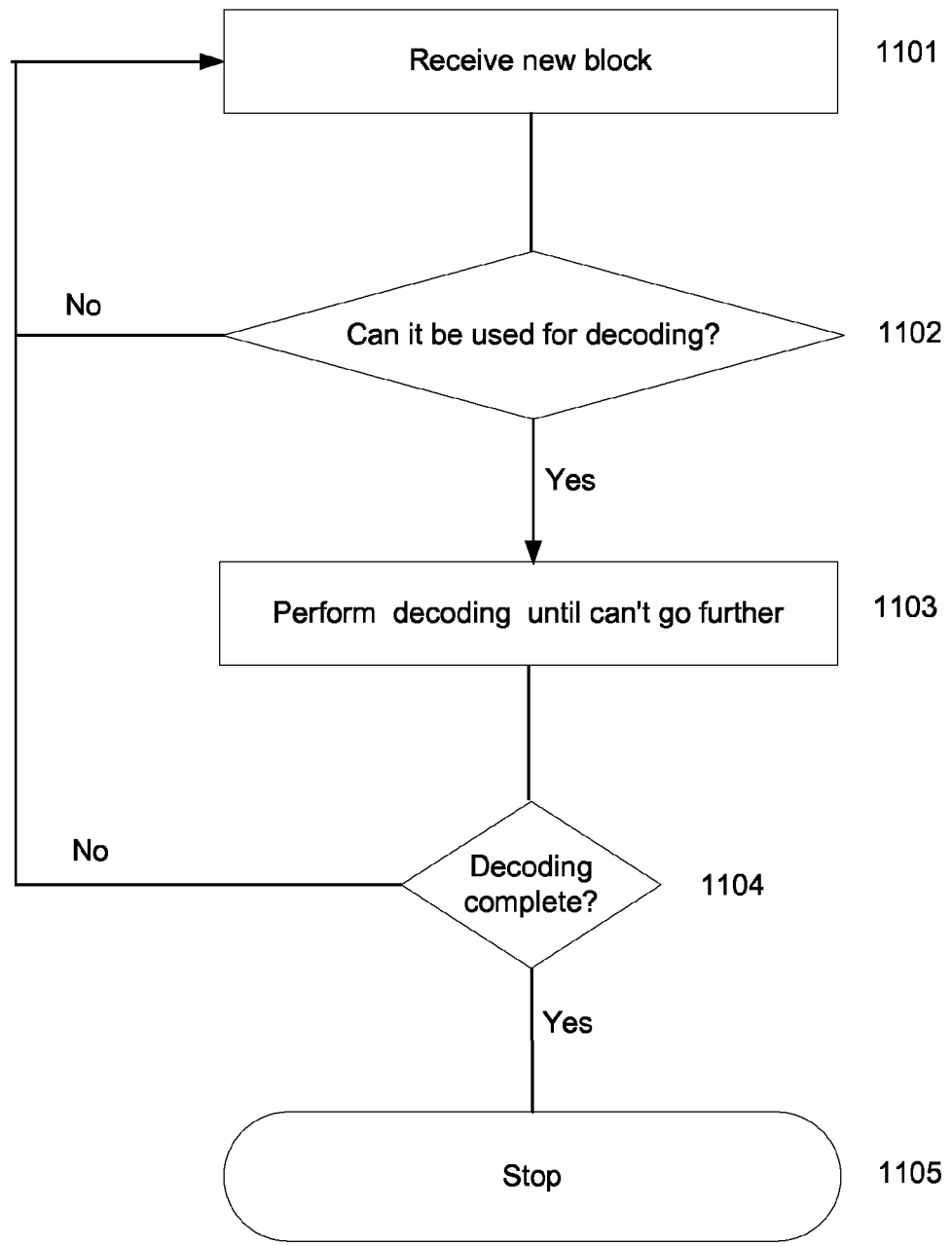
FIG. 11 shows a flow diagram of another decoding optimisation example.

Alternatively, the decoding process may begin whilst the node continues to receive additional blocks, as shown in the example flow diagram of FIG. 11. When the node receives a new block (step 1101) it determines whether this received block, which is likely to be an encoded block, can be used to decode other blocks (step 1102). If it is determined that the newly received block does not permit any decoding, the node will wait for the receipt of the next block (in step 1101). However, if the newly received block does enable further decoding, decoding is started (step 1103). When the decoding stage cannot proceed further, the node determines whether decoding is complete (step 1104) and if not, the node waits for the arrival of the next block which can assist with decoding (step 1101). Once all the blocks have been decoded, the process stops (step 1105). The decoding process (in step 1103) may use the techniques described above in reference to FIG. 10 or any other suitable decoding technique. Decoding in parallel with receiving blocks is beneficial because the cost (in time and processing load) of decoding is spread in time and also because the decoding starts earlier, it should be completed earlier.

There are a number of algorithms which may be used to determine whether a received block can be used to decode other blocks (step 1102). In a first example, the node determines whether the received block is encoded from only a single block of the original file, e.g. block A. If so, the matrix of coefficients can be searched to determine encoded blocks of degree 2, where one of the two blocks is block A e.g. blocks A & B. From the received blocks A and A&B, block B can be determined. The matrix of coefficients can then be searched for both encoded blocks of degree 2 where one of the two blocks is block B and also encoded blocks of degree 3, where two of the three blocks are blocks A and B. This process is an iterative process which may lead to considerable simplification of the final decoding process once all the blocks have been received. In another example, the node may determine whether the newly received encoded block defines a sub-matrix which can be solved by matrix inversion. For example if the coefficient vector of the received block has non-zero entries in only columns 1, 2, 3 and 10, the matrix of coefficients can be searched for other rows containing non-zero entries in only columns 1, 2, 3 and 10. If another 3 such rows are identified, matrix inversion can be performed on this sub-matrix to decode the $1^{st}$, $2^{nd}$, $3^{rd}$ and $10^{th}$ original blocks.

In a second decoding optimisation example, a number of blocks may be read into memory and decoded in parallel. For example, where the original file was divided into segments (see first encoding optimisation example described above), all the blocks relating to a segment may be loaded into memory and then decoded in parallel. The segments may be selected sequentially such that the decoding process gives priority to blocks from earlier segments. This may be particularly beneficial where the data relates to streaming video such that segments which are required earlier are decoded before segments which are required later. This parallel decoding technique may also be applied where the original file is not divided into segments. Again a subset of all the blocks received may be read in to memory and decoded in parallel and the subset may be defined by all the blocks which have a non-zero value in a particular column of the coefficient matrix, e.g. all the blocks which are a linear combination of block A and other blocks. By dividing the decoding process up in this way, the number of arithmetic operations can be reduced from $O(n^2)$, where n is the number of blocks in the original file, to $O(n*k)$, where k is the number of blocks in a segment/subset.

In a third decoding optimisation example, a sliding window is used across all received blocks for decoding. This optimisation provides an efficient use of disk and OS caches and allows the operating system to assist in preparing for the decoding process. In this example, a small portion or window (e.g. 10 kB) of each encoded block is loaded into memory and a buffer is allocated and used to decode the corresponding portion of each block. Once the portion of the block has been decoded, it can be written to disk. Due to the sequential processing of successive portions of the encoded blocks, the operating system can pre-load the next portion of data for each block in parallel with the decoding of the first block so that there is minimal delay between decoding each portion.

The above description relates to decoding optimisations which may be employed to reduce the processing load and time required to decode blocks of data received from other nodes in the network. Each of the above optimisations may be implemented independently of the others or alternatively two or more of the optimisation techniques may be used in combination to further increase the optimisation of the encoding process. The decoding optimisations may be implemented in addition to, or separately from, any of the encoding optimisations described earlier.

The above description referred to file distribution. The optimisations described above may also be applied to file sharing applications.

Those skilled in the art will realise that storage devices utilised to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realise that by utilising conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

The steps of the methods described herein may be carried out in any suitable order, or simultaneously where appropriate.

It will be understood that the above description of a preferred embodiment is given by way of example only and that various modifications may be made by those skilled in the art.

The invention claimed is:

1. A method comprising:
   encoding content for distribution over a network, the content being divided into a plurality of segments and each segment comprising a plurality of un-encoded blocks of data, wherein encoding content for distribution over the network comprises:
   selecting a segment from the plurality of segments stored in memory;
   selecting a target degree for a new encoded block, wherein a degree of an encoded block is a quantity of un-encoded blocks that correspond to the encoded block;
   selecting, from a store of previously-encoded blocks, at least two previously-encoded blocks corresponding to the selected segment, wherein each of the at least two previously-encoded blocks has a degree less than or equal to the target degree; and
   creating the new encoded block having a degree equal to the target degree from a linear combination of the selected at least two previously-encoded blocks using a processor.

2. A method according to claim 1, wherein selecting a segment comprises an infrequent but periodic step of selecting all of the plurality of segments.

3. A method according to claim 1, wherein selecting a segment comprises:
   randomly selecting a segment from the plurality of segments.

4. A method according to claim 1, wherein selecting a segment comprises:
   selecting a segment from the plurality of segments according to a specified sequence.

5. A method according to claim 1, wherein selecting at least two previously-encoded blocks comprises: selecting all available previously-encoded blocks of the selected segment from a store of encoded blocks.

6. A method according to claim 1, further comprising: storing the new encoded block.

7. A method according to claim 6, wherein creating a new encoded block uses a pre-computed look up table.

8. A method according to claim 1, wherein the content comprises a software update file, and the software update file is to be distributed over the network.

9. A method according to claim 8, wherein the software update file is to be distributed to nodes in the network.

10. A method according to claim 1, wherein the content comprises a patch file to be distributed over the network.

11. One or more computer-readable memory to store executable instructions, when the executable instructions are executed by a processor, the processor implements acts for encoding content for distribution over a network, the content being divided into a plurality of un-encoded blocks of data, the acts comprising:

selecting a target degree for a new encoded block, wherein a degree of an encoded block is a number of un-encoded blocks corresponding to the encoded block;

attempting to select a plurality of previously-encoded blocks from a store of previously-encoded blocks to create the new encoded block, the new encoded block and each selected previously-encoded block having a degree which is less than or equal to the target degree;

increasing, if the attempt fails, the target degree by one and repeating the attempting step; and creating, if the attempt succeeds, the new encoded block from a linear combination of the selected plurality of previously-encoded blocks.

12. The computer-readable memory according to claim 11, wherein the selected plurality of previously-encoded blocks comprises a maximum number of previously-encoded blocks from which the new encoded block can be created.

13. The computer-readable memory according to claim 12, the acts further comprising:

storing the new encoded block.

14. The computer-readable memory according to claim 13, wherein creating the new encoded block uses a pre-computed look up table.

15. A method of encoding content for distribution over a network, the content being divided into a plurality of un-encoded blocks of data, the method comprising:

selecting a plurality of encoded blocks from a store of encoded blocks in the network, each encoded block having a degree that is less than or equal to a target degree, the degree being a number of un-encoded blocks from which each of the encoded blocks are created;

creating a new encoded block from a linear combination of the selected plurality of encoded blocks; and storing the new encoded block in memory.

16. A method according to claim 15, wherein the new encoded block is stored in a cache.

17. A method according to claim 16, wherein storing comprises:

storing the new encoded block for a predetermined period of time.

18. A method according to claim 17, wherein the store of encoded blocks comprises a first part located in a main memory of a node and a second part located in a cache of the node.

19. A method according to claim 18, wherein creating the new encoded block uses a pre-computed look up table.

\* \* \* \* \*